United States Patent [19]

Nakashima et al.

[11] Patent Number: 4,779,986
[45] Date of Patent: Oct. 25, 1988

[54] REDUCTION PROJECTION SYSTEM ALIGNMENT METHOD AND APPARATUS

[75] Inventors: Naoto Nakashima, Yokohama; Yoshitada Oshida, Fujisawa, both of Japan

[73] Assignee: Hitachi, Ltd., Tokyo, Japan

[21] Appl. No.: 851,723

[22] Filed: Apr. 14, 1986

[30] Foreign Application Priority Data

Apr. 12, 1985 [JP]  Japan ................................ 60-76380

[51] Int. Cl.$^4$ ............................................. G01B 11/00
[52] U.S. Cl. ..................................... 356/401; 356/400
[58] Field of Search ...................... 356/399, 400, 401; 250/548, 557, 561; 355/53, 55

[56] References Cited

U.S. PATENT DOCUMENTS

| | | | |
|---|---|---|---|
| 4,355,892 | 10/1982 | Mayer et al. | 355/77 |
| 4,498,762 | 2/1985 | Uehara et al. | 356/401 |
| 4,566,795 | 1/1986 | Matsuura et al. | 356/401 |
| 4,592,625 | 6/1986 | Uehara et al. | 356/401 |
| 4,616,130 | 10/1986 | Omata | 356/401 |

FOREIGN PATENT DOCUMENTS

| | | |
|---|---|---|
| 110234 | 9/1981 | Japan . |
| 138134 | 8/1982 | Japan . |
| 49910 | 3/1983 | Japan . |
| 112330 | 7/1983 | Japan . |

Primary Examiner—F. L. Evans
Attorney, Agent, or Firm—Antonelli, Terry & Wands

[57] ABSTRACT

A reduction projection system alignment method for detecting the positions of an alignment pattern on a reticle and an alignment pattern on a wafer projected onto a reticle by a reduction projection lens so as to relatively align the reticle and wafer. This method comprises providing spatial images emanating from patterns on the reticle and wafer surfaces as alginment patterns of at least one of the reticle and wafer, and detecting the alignment patterns of the reticle and wafer by the same detection optical system using lights which are different in the wavelength from that of an exposure light and different from each other between the reticle and wafer. An apparatus for performing this method is also disclosed.

17 Claims, 7 Drawing Sheets

PATTERN DETECTION SIGNAL (a) DIFFRACTION IMAGE CONPONENT (d) DIFFRACTION IMAGE COMPONENT (b) WAFER PATTERN COMPONENT (e) WAFER PATTERN COMPONENT (c) DETECTED WAVEFORM (f) DETECTED WAVEFORM

PRIOR ART DEVICE

INVENTIVE DEVICE

REDUCTION PROJECTION SYSTEM ALIGNMENT METHOD AND APPARATUS

BACKGROUND OF THE INVENTION

The present invention relates to a method for detecting alignment patterns in a wafer exposure device, and more particularly to a reduction projection system alignment method suitably adapted for detecting TTL (through the lens) system alignment in a reduction projection exposure device.

In the fabrication of integrated circuits including fine circuit patterns, such as VLSI's, a reduction projection exposure device, in which a reticle pattern reduced to 1/5 or 1/10 using a reduction lens is projected and printed on a wafer, has been frequently employed. When printing the pattern, it must be caused to coincide with a pattern previously formed on the wafer in their position with a high precision. This work is referred to as alignment. This alignment can be carried out with the highest precision by means of a method of detecting the alignment state of a reticle pattern relative to a wafer pattern through a reduction lens (this is referred to as a TTL system). In this case, the reduction lens generally eliminates color aberrations, spherical aberrations, etc. only at a exposure wavelength (monochromatic light such as a g-line, i-line, etc.) so as to provide a high resolution. Therefore, if the alignment pattern detection is carried out using the exposure wavelength or the wavelength in the vicinity thereof, respective alignment pattern images of the wafer and reticle can be detected with the wafer surface held at a focusing position during the exposure. Such a detection system is described in e.g. Japanese Patent Unexamined Publication No. 138,134/82. This system has a disadvantage that resists (exposure agents) in the peripheries of alignment patterns are exposed during the detection.

To obviate this disadvantage, the pattern detection may be carried out with monochromatic light of the wavelength not exposing the resist. In this case, however, it is necessary to correct the degree of out-of-focus of the reduction lens due to its color aberration. For such a detection system, there has been adopted a correction optical system disclosed in Japanese Patent Unexamined Publication No. 110,234/81 or a detection device in which a spatial image resulting from the alignment pattern of the reticle or wafer is employed for the detection, such as disclosed in Japanese Patent Unexamined Publication Nos. 49,910/83 and 112,330/83.

In these detection devices, the alignment patterns (including spatial images) on the wafer and reticle are located in a focusing plane of a pattern detection light through the reduction lens. Thus, no consideration has been taken on some fear of distorting pattern detection waves, reducing the alignment precision or producing any erroneous detection because of the superposition of the alignment patterns of the wafer and reticle.

SUMMARY OF THE INVENTION

An object of the present invention is to provide a high performance TTL reduction projection system alignment method which can attenuate interferences between alignment pattern images of a wafer and reticle and an apparatus for implementing this method.

To realize the TTL alignment with a high precision, it is necessary to once focus images of the alignment patterns of the wafer and reticle in a plane at the same distance from a reduction lens. In an alignment pattern detection optical system to be located after the reduction lens, lenses with several aberrations corrected for wide-band wavelengths can be used. Thus, the above object can be attained by detecting the alignment pattern images of the wafer and reticle in the same plane in accordance with the present invention.

The above and other objects, features and advantages of the present invention will be more clearly understood from the following detailed descriptions taken in conjunction with the accompanying drawings.

DESCRIPTION OF THE PREFERRED EMBODIMENTS

Figure 1:
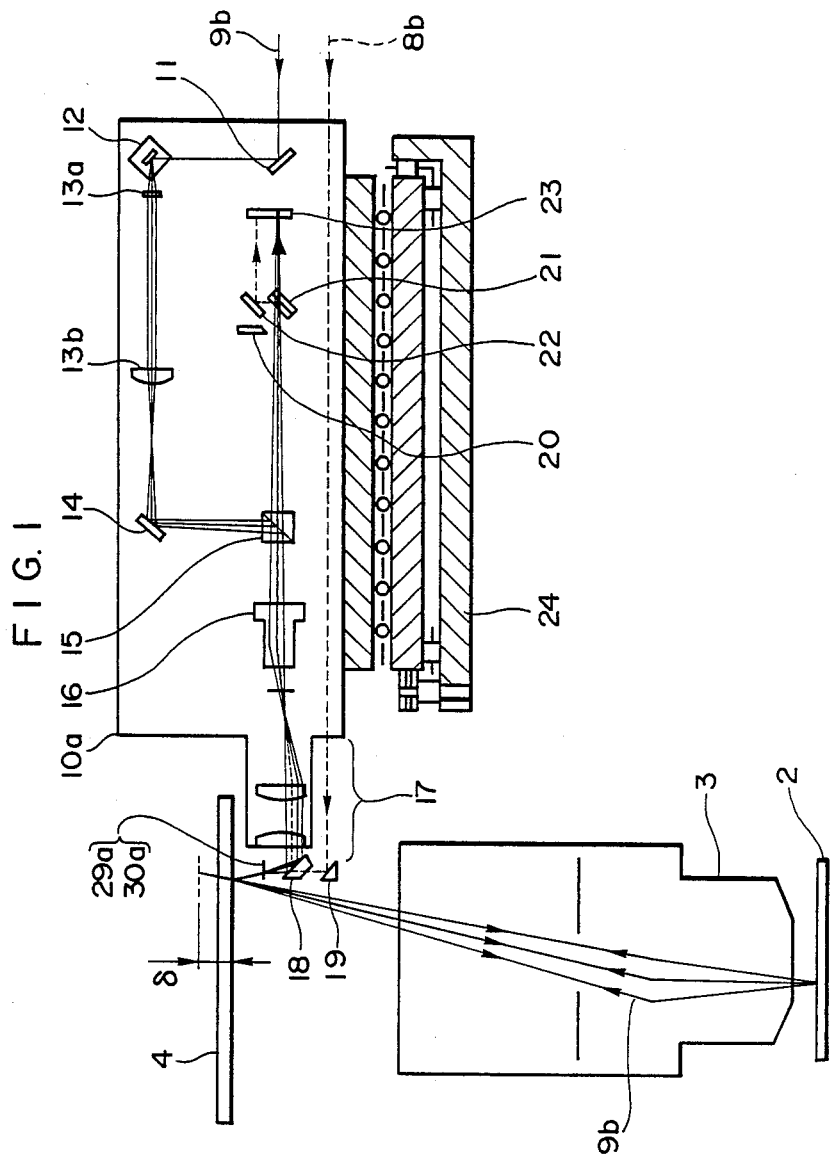
FIG. 1 is a longitudinal sectional view of a detection system arrangement in one embodiment of the present invention.
Figure 2:
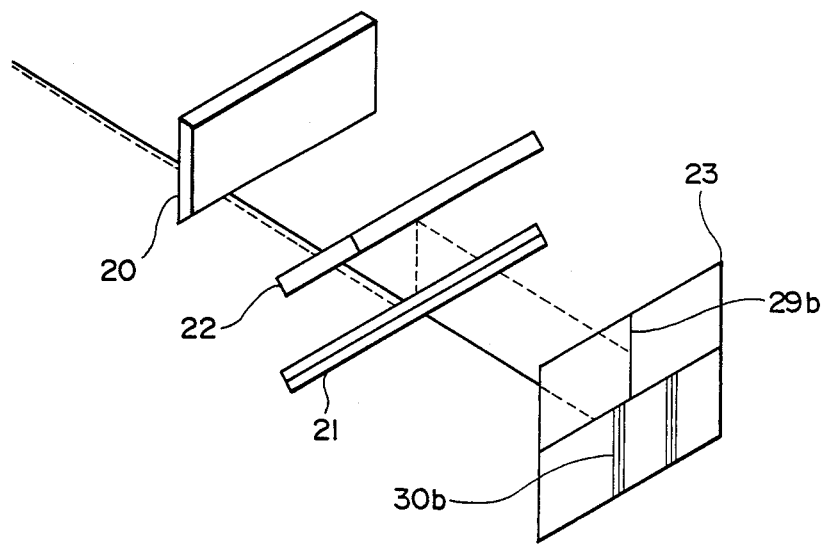
FIG. 2 is a perspective view of details of an image pick-up portion in one embodiment of the present invention.
Figure 3:
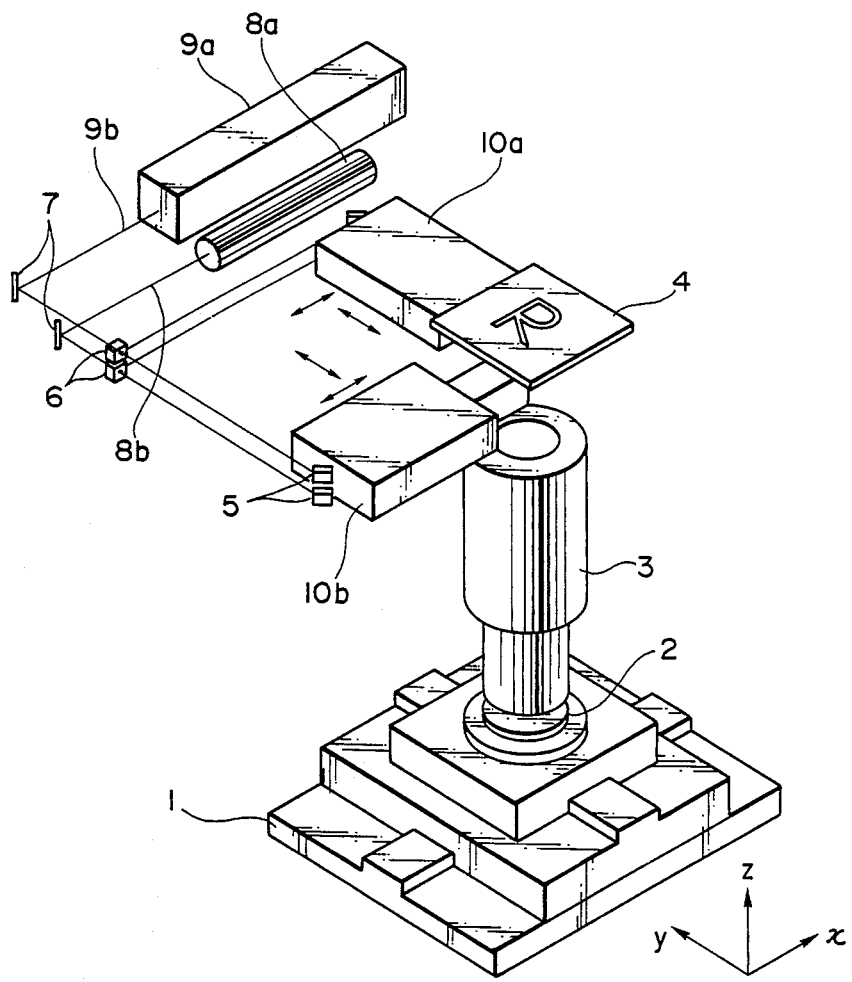
FIG. 3 is a perspective view of an entire arrangement of one embodiment of the present invention.

One embodiment of the present invention will be explained below with reference to FIGS. 1 to 6.

The arrangement of the present invention is such as shown in FIGS. 1 to 5. As seen from FIG. 3, an x-axis side detection portion 10a and a y-axis side detection portion 10b are mounted, as a TTL alignment detection system, on a stage 24 so as to be rotatable in the x and y directions at the lower side of a reticle 4. (a mask may be used instead of the reticle 4) Laser beams 8b (wavelength: 632.8 nm) and 9b (wavelength: 514.5 nm) emanating from a He-Ne laser tube 8a and Ar+ laser tube 9a, respectively are directed to these two detection portions 10a and 10b by means of mirrors 5, 7 and a beam splitter 6 even when both detection portions 10a and 10b are moved in the x and y directions.

1 designates a wafer stage, 2 designates a wafer and 3 designates a reducing lens.

Figure 4:
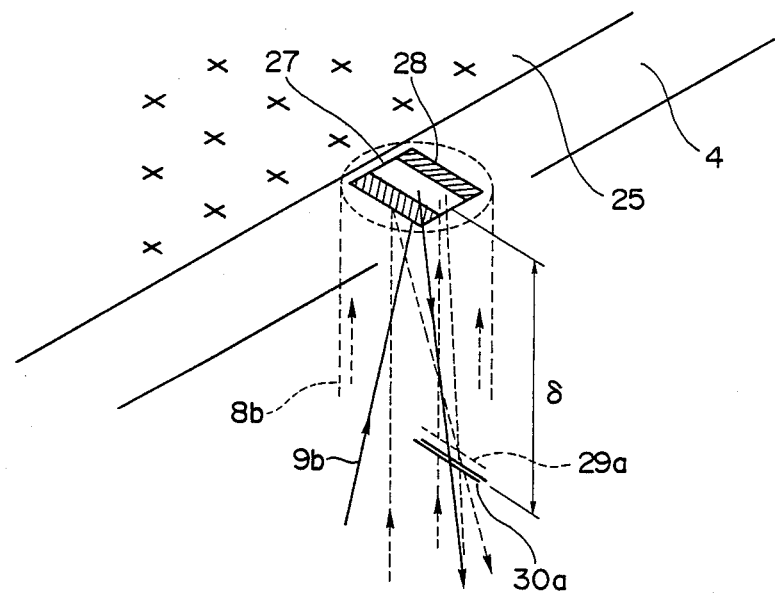
FIG. 4 is a perspective view of focusing states of spatial images of a wafer and reticle in one embodiment of this invention.

The insides of detection portions are constructed as follows. As can be seen from FIG. 1, the He-Ne laser beam 8b is reflected at a prism 19 and incident on a Fresnel pattern 28 of a reticle 4 with a mirror portion 27 through a mirror 18 (FIG. 4). The diffraction light from Fresnel pattern 28 produces a spatial image 29a. This spatial image 29a is extensively projected onto a solid state image pickup element (detection element) 23 by means of an optical system consisting of a mirror 18, a relay lens 17, a magnifying lens 16, a beam splitter 15, a dichroic mirror 21 and a mirror 22. 29b illustrates an enlargement-projected image. On the other hand, the Ar+ laser beam 9b is incident on the wafer 2 through a beam splitter 15, the magnifying lens 16, the relay lenses 17, the mirror lens 18, the mirror portion 27 on the reticle 4, and the reduction lens 3 by means of an illumination optical system consisting of mirrors 11, 14, a galvanomirror 12 and lenses 13a, 13b. The reflection light from wafer 2 travels along the reverse path from reduction lens 3 onto solid-state image pickup element 23 through beam splitter 15 and dichroic mirror 21. 30a is an enlarged image of the wafer pattern through reduction lens 3 and 30b is an image extensively projected by means of an optical system of the detection portion. 20 denotes a knife edge for preventing stray light.

The operation of this embodiment will be explained below. The reduction lens 3 is a lens with its aberrations corrected relative to the exposure wavelength (g line: 436 nm). Therefore, if the wafer pattern is illuminated with the Ar+ laser beam not exposing the resist material, the corresponding wafer pattern image is focused because of its longitudinal color aberration at the position away from the reticle surface. In this embodiment, the reflection light from the wafer is reflected at the mirror portion 27 provided on the reticle surface and focused as wafer pattern image 30a at the spatial position below and away from the reticle by $\delta \approx 4$ mm. To minimize the attenuation of alignment accuracy which may occur because of the inclination of the detection portions, the image representative of the reticle position must be produced in the same plane as the wafer pattern image 30a. Thus, the spatial image 29a based on Fresnel pattern is employed as an image representative of the reticle position.

Figure 8:
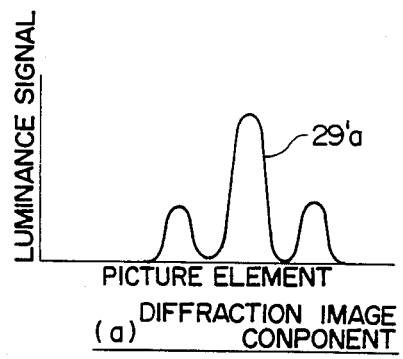
FIGS. 8(a), (b) and (c) show a reticle spatial image, wafer pattern image and the reticle spatial image interfered with the wafer pattern image in the prior art device, and FIGS. 8(d), (e) and (f) show those in the present invention.
Figure 8:
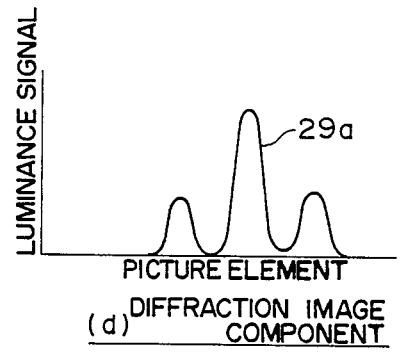
Figure 8:
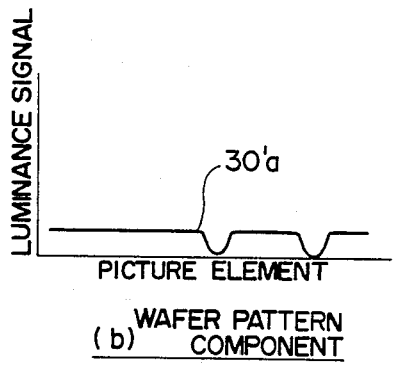
Figure 8:
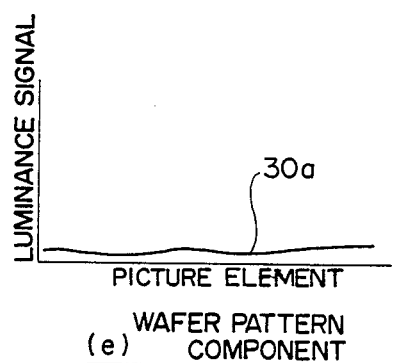
Figure 8:
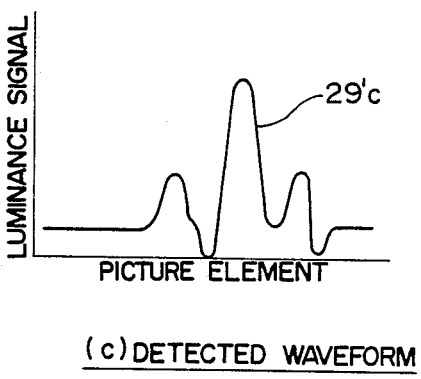
Figure 8:
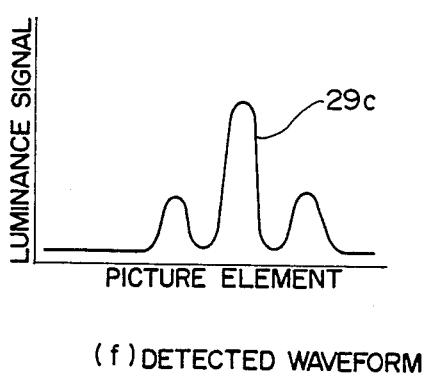

This spatial image 29a can be produced also using the laser beam for wafer pattern detection. In this case, however, a part of the illuminated laser beam may be reflected at mirror portion 27 and Fresnel pattern on the reticle surface, and may be incident on the wafer through the reduction lens 3. The reflection light therefrom may be focused, as a wafer pattern image 30a' (see FIG. 8(b)), onto an imaging plane of a reticle spatial image 29a' (see FIG. 8(a)). Thus, since this wafer pattern image may interfere with the reticle spatial image 29a' to provide a distorted reticle spatial image 29c' (see FIG. 8(c)), thereby causing some error in the reticle position detection.

To obviate such a difficulty, in accordance with this invention, the reticle spatial image 29a is adapted to be produced by the He-Ne laser beam that is larger by 14 nm in its longitudinal color aberration than the Ar+ laser beam, not so as to place the reticle spatial image 29a and a wafer alignment pattern 26 in an imaging or focusing relation through the reduction lens 3. Thus, the interference between the reticle alignment pattern image 29a and the wafer alignment pattern image 30a is prevented (see FIGS. 8(d)–(f)). Further, as seen from FIG. 2, enlarged images 29b and 30b corresponding to the images 29a and 30a provided by the same optical system are individually detected by means of the dichroic mirror 21 provided on the way to solid-state image pickup element 23.

Figure 5:
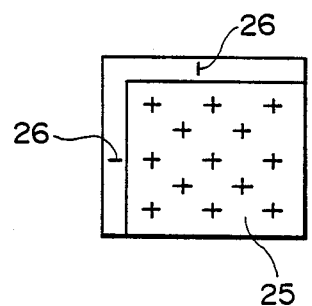
FIG. 5 is a plan view of the location of an alignment pattern of a wafer.
Figure 6A:
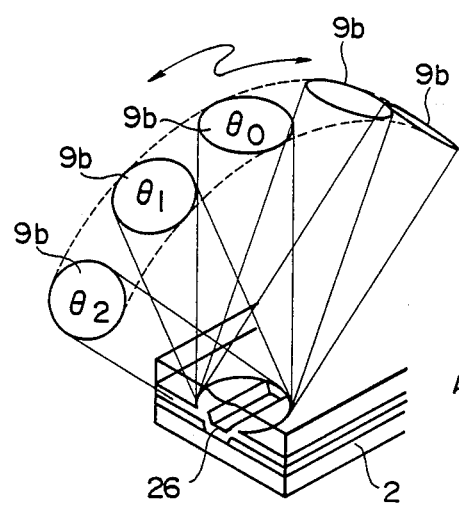
FIG. 6A is a perspective view of wafer swinging illumination states and FIG. 6B shows the corresponding effects.
Figure 6B:
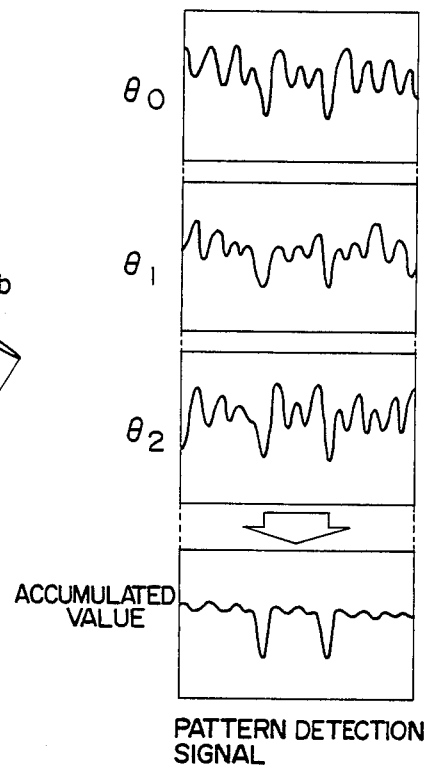

In this embodiment, this pickup element is divided into two parts, upper and lower parts. Furthermore, the incident angle of the laser light illuminated onto the wafer pattern is swung like $\theta_0$, $\theta_1$ and $\theta_2$, as shown in FIG. 6A, so as to reduce the noise due to the light interference on the wafer. More specifically, the laser light that is high in its coherence, if it is incident on the wafer surface with a fixed angle, produces interference because of its minute unevenness of the wafer surface to provide random interference fringes called a speckle pattern. Thus, the incident angle of $\theta_0$, for example, provides a pattern detection signal with more noise component such as shown in FIG. 6B. However, if the incident angle is altered like $\theta_0$, $\theta_1$ and $\theta_2$, the speckle pattern varies in its position. Therefore, as shown in FIG. 6B, if the pattern detection signals relative to the respective incident angles are accumulated, the speckle patterns can be averaged. On the other hand, since the alignment pattern signal is substantially fixed regardless of the incident angle, a higher S/N ratio can be realized for the accumulated pattern detection signal. Incidentally, the wafer alignment pattern 26, as shown in FIG. 5, is a linear pattern that is substantially radial with respect to a circuit pattern 25.

Accordingly, in accordance with this embodiment, the interference betwee the reticle alignment pattern and the wafer alignment pattern can be attenuated, with the corresponding images kept in the same plane, in such a way that the reticle alignment pattern image 29a and the wafer alignment pattern 26 are not placed in a focusing or imaging relation through the reduction lens. This embodiment, therefore, provides an advantage of implementing a high precision TTL system alignment pattern detection device.

Figure 7:
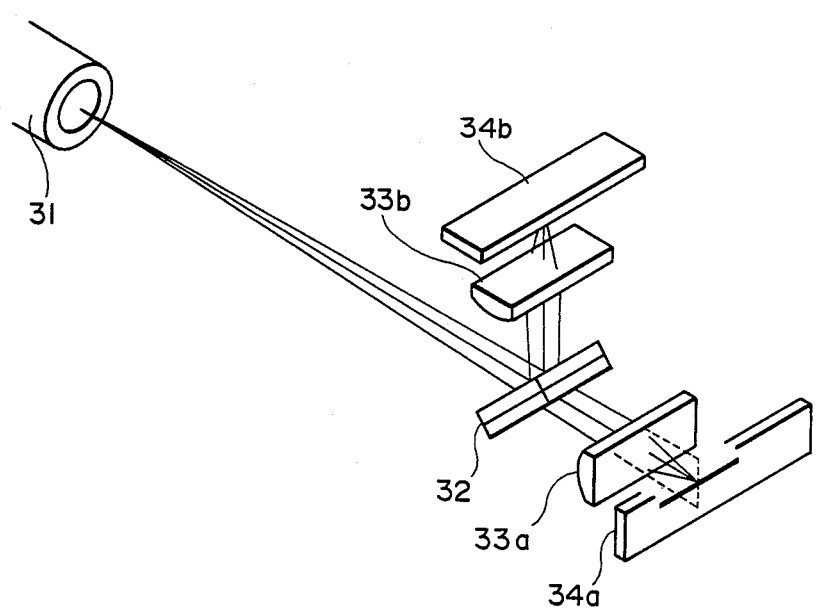
FIG. 7 is a perspective view of a detection system arrangement in another embodiment of the present invention.

Another embodiment of this invention will be explained below with reference to FIG. 7.

This embodiment is the same as the embodiment mentioned above except the detection element. Namely, in this embodiment, the enlarged projected images of the reticle alignment pattern and wafer alignment pattern from the optical system 31 are separated by a dichroic mirror 32 and are individually detected by means of a couple of CCD linear image sensors 34a, 34b and a couple of cylindrical lenses 33a, 33b. Therefore, the same function and advantage as in the above embodiment are provided.

Further, any detection element that is capable of providing different detection signals relative to Ar+ laser light (green) and He-Ne laser light (red) provides the same function and advantage.

Accordingly, in accordance with the present invention, the interference between reticle and wafer alignment patterns can be attenuated with the corresponding images kept in the same plane, in such a way that the reticle pattern image and the wafer alignment pattern are not placed in a focusing or imaging relation through a reduction lens, and so the present invention provides an advantage of realizing a higher precision alignment. This advantage is exemplified in that the reticle alignment pattern detection precision is greatly enhanced from $\pm 0.12$ $\mu$m to $\pm 0.03$ $\mu$m. Moreover, in accordance with the present invention, the reticle and wafer alignment patterns that are spatially adjacent to each other can be extensively projected by the same enlargement optical system and simultaneously detected, and so the present invention also provides an advantage of realizing high speed pattern detection property less influenced from the image distortion in the detection optical system.

We claim:

1. A reduction projection system alignment method for detecting the positions of an alignment pattern on a reticle and an alignment pattern on a wafer projected onto a reticle by a reduction projection lens so as to relatively align the reticle and wafer, comprising the steps of:

directing a first light beam having a first wavelength different from that of an exposure light by reflecting the first light beam on a mirror pattern formed on the reticle to the alignment pattern on the wafer through said reduction projection lens by a first illumination means, the first light beam emanating from a first light source;

directing a second light beam having a second wavelength different from that of the exposure light and said first wavelength to a Fresnel pattern formed on the reticle by a second illumination means, said second light beam emanating from a second light source;

forming both a spatial image focused by projecting an image of the wafer alignment pattern through the reduction projection lens and reflecting it from the mirror pattern, and a spatial image diffracted by said Fresnel pattern of the reticle alignment pattern as enlarged images by an optical system; and separately detecting said enlarged images with an image pickup means.

2. A reduction projection system alignment method according to claim 1, wherein the step of directing a first light beam having a first wavelength and the step of directing a second light beam having a second wavelength includes utilizing a wavelength for the first light beam which is smaller than the wavelength utilized for the second light beam.

3. A reduction projection system alignment method according to claim 1, wherein said first light source is a $Ar^+$ laser beam source and said second light source is He-Ne laser beam source.

4. A reduction projection system alignment apparatus for detecting the positions of an alignment pattern on a reticle and an alignment pattern on a wafer projected onto a reticle by a reduction projection lens so as to relatively align the reticle and wafer, comprising:

first illuminating means for reflecting light having a first wavelength different from that of an exposure light from a mirror pattern formed on the reticle so as to illuminate the alignment pattern on the wafer through said reduction projection lens;

second illuminating means for illuminating a Fresnel pattern formed on the reticle with light having a second wavelength different from that of the exposure light and said first wavelength;

an optical system for forming both a spatial image focused by projecting an image of the wafer alignment pattern through the reduction projection lens and reflecting it from the mirror pattern and a spatial image diffracted by said Fresnel pattern of the reticle alignment pattern as enlarged images; and image pickup means for separately detecting said enlarged images and having a pair of light paths which differ in length.

5. A reduction projection system alignment apparatus according to claim 4, wherein said first illumination means enables swinging movement of the illumination light on the wafer alignment pattern through the reduction projection lens.

6. A reduction projection system alignment apparatus according to claim 4, wherein said optical system includes a mirror provided below said reticle alignment pattern, relay lenses, and a magnifying lens.

7. A reduction projection system alignment apparatus according to claim 6, wherein said first illumination means includes a beam splitter for supplying incident light through said optical system to said mirror pattern.

8. A reduction projection system alignment apparatus according to claim 7, wherein said first illumination means enables swinging movement of the illumination light on the wafer alignment pattern through said reduction projection lens.

9. A reduction projection system alignment apparatus according to claim 6, wherein said second illumination means illuminates a lower side of the reticle through said mirror.

10. A reduction projection system alignment apparatus according to claim 4, wherein said first illumination means includes a $Ar^+$ laser beam source.

11. A reduction projection system alignment apparatus according to claim 4, wherein said second illumination means includes an He-Ne laser beam source.

12. A reduction projection system alignment apparatus according to claim 5, wherein said first illumination means includes an $Ar^+$ laser beam source.

13. A reduction projection system alignment apparatus according to claim 5, wherein said second illumination means includes a He-Ne laser beam source.

14. A reduction projection system alignment apparatus according to claim 4, wherein said image pickup means includes a dichroic mirror for separating said enlarged images, a pair of cylindrical lenses for converging said enlarged images, and a pair of linear image sensors for picking up said enlarged images.

15. A reduction projection system alignment apparatus according to claim 5, wherein said image pickup means includes a dichroic mirror for separating said enlarged images, a pair of cylindrical lenses for converging said enlarged images, and a pair of linear image sensors for picking up said enlarged images.

16. A reduction projection system alignment apparatus for detecting the positions of an alignment pattern on a reticle and an alignment pattern on a wafer projected onto a reticle by a reduction projection lens so as to relatively align the reticle and wafer, comprising:

first illumination means for directing light having a first wavelength different from that of an exposure light to the alignment pattern on the wafer through said reduction projection lens;

second illumination means for directing light having a second wavelength different from that of the exposure light and said first wavelength to the reticle alignment pattern of the reticle;

an optical system for forming both a spatial image focused by projecting an image of the wafer alignment pattern through the reduction projection lens and a spatial image of the reticle alignment pattern as enlarged images; and image pickup means for separately detecting said enlarged images and having a pair of light paths which differ in length.

17. A reduction projection system alignment apparatus according to claim 16, wherein said first illumination means enables swinging movement of the illumination light on the wafer alignment pattern through said reduction projection lens.

* * * * *